US010060816B2

United States Patent
Kautzsch et al.

(10) Patent No.: US 10,060,816 B2
(45) Date of Patent: *Aug. 28, 2018

(54) SENSOR STRUCTURES, SYSTEMS AND METHODS WITH IMPROVED INTEGRATION AND OPTIMIZED FOOTPRINT

(71) Applicant: Infineon Technologies Dresden GmbH, Dresden (DE)

(72) Inventors: Thoralf Kautzsch, Dresden (DE); Heiko Froehlich, Radebeul (DE); Mirko Vogt, Dresden (DE); Maik Stegemann, Pesterwitz (DE); Andre Roeth, Dresden (DE); Bernhard Winkler, Regensburg (DE); Boris Binder, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/372,992

(22) Filed: Dec. 8, 2016

(65) Prior Publication Data

US 2017/0089790 A1  Mar. 30, 2017

Related U.S. Application Data

(63) Continuation of application No. 14/163,205, filed on Jan. 24, 2014, now Pat. No. 9,546,923.

(51) Int. Cl.
*G01L 9/00* (2006.01)
*B81C 1/00* (2006.01)

(52) U.S. Cl.
CPC .......... *G01L 9/0072* (2013.01); *G01L 9/0041* (2013.01); *G01L 9/0073* (2013.01); *B81C 1/00158* (2013.01)

(58) Field of Classification Search
None
See application file for complete search history.

(56) References Cited

U.S. PATENT DOCUMENTS

| 4,954,789 A | 11/1990 | Sampsell |
| 5,471,723 A | 12/1995 | Luder et al. |

(Continued)

FOREIGN PATENT DOCUMENTS

| CN | 202420729 U | 9/2012 |
| CN | 102980715 A | 3/2013 |
| CN | 103257005 A | 8/2013 |

OTHER PUBLICATIONS

Notice of Allowance dated Oct. 31, 2016 for U.S. Appl. No. 14/163,205.

(Continued)

*Primary Examiner* — Andre Allen
(74) *Attorney, Agent, or Firm* — Eschweiler & Potashnik, LLC

(57) ABSTRACT

Embodiments relate to sensors and more particularly to structures for and methods of forming sensors that are easier to manufacture as integrated components and provide improved deflection of a sensor membrane, lamella or other movable element. In embodiments, a sensor comprises a support structure for a lamella, membrane or other movable element. The support structure comprises a plurality of support elements that hold or carry the movable element. The support elements can comprise individual points or feet-like elements, rather than a conventional interconnected frame, that enable improved motion of the movable element, easier removal of a sacrificial layer between the movable element and substrate during manufacture and a more favorable deflection ratio, among other benefits.

19 Claims, 5 Drawing Sheets

(56) References Cited

U.S. PATENT DOCUMENTS

| | | | |
|---|---|---|---|
| 5,479,827 | A | 1/1996 | Kimura et al. |
| 6,640,642 | B1 | 11/2003 | Onose et al. |
| 7,040,173 | B2 | 5/2006 | Dehe |
| 7,181,972 | B2 | 2/2007 | Dasgupta et al. |
| 8,374,364 | B2 | 2/2013 | Kasai et al. |
| 8,869,622 | B2 | 10/2014 | Fujii et al. |
| 8,952,595 | B2 | 2/2015 | Huang |
| 2007/0019923 | A1 | 1/2007 | Sasagawa |
| 2012/0216621 | A1 | 8/2012 | Oto |
| 2013/0127879 | A1 | 5/2013 | Burns et al. |
| 2014/0004364 | A1 | 1/2014 | Takahashi |
| 2015/0122042 | A1 | 5/2015 | Lin et al. |
| 2015/0210535 | A1 | 7/2015 | Roth |

OTHER PUBLICATIONS

Notice of Allowance dated Sep. 14, 2016 for U.S. Appl. No. 14/163,205.

Non-Final Office Action dated Apr. 28, 2016 for U.S. Appl. No. 14/163,205.

Non-Final Office Action dated Nov. 10, 2015 for U.S. Appl. No. 14/163,205.

SENSOR STRUCTURES, SYSTEMS AND METHODS WITH IMPROVED INTEGRATION AND OPTIMIZED FOOTPRINT

REFERENCE TO RELATED APPLICATION

This application is a continuation of U.S. application Ser. No. 14/163,205 filed on Jan. 24, 2014, the contents of which are incorporated by reference in their entirety.

FIELD

The invention relates generally to sensors and more particularly to structures for and methods of forming sensors comprising moveable elements, such as membranes or lamellas, that are easier to manufacture as integrated components and provide improved deflection of the membrane or lamella.

BACKGROUND

Sensors are commonly used in a variety of applications, including electronics, automotive and consumer goods, among others. Some types of sensors comprise a membrane, lamella or other suitable structure that flexes, deforms or otherwise moves in response to a physical quantity to be sensed or measured. One example of such a sensor is a pressure sensor, which can sense or measure pressure related to a gas, fluid, mechanical or other force. The flexure, deformation and/or movement of the moveable portion of the sensor (e.g., the membrane, lamella or other structure) can be sensed by a variety of technologies, including capacitive, piezoresistive, piezoelectric, electromagnetic, optical or some other technology, and the related pressure determined therefrom. For example, a pressure sensor can comprise a flexible membrane that flexes or otherwise deforms when a pressure is present. The flexure of the membrane can be detected capacitively by an electrode arranged proximate the membrane, as a capacitance between the membrane and the electrode changes as the membrane sags or expands.

Regardless of type, sensors often operate as parts of larger systems and therefore may be integrated within these systems. In some applications, such as automotive airbag sensors, a pressure sensor can be integrated within the airbag application-specific integrated circuit (ASIC). As the processes for manufacturing ASICs develop and evolve, it can be challenging to integrate manufacture of the sensors with the ASIC without increasing the complexity of or having to alter the fundamental manufacturing processes. For example, many ASICs are constructed using CMOS (complementary metal-oxide-semiconductor) technologies, and integrating pressure sensor construction into suitable CMOS processes can be complicated and/or expensive, sometimes requiring changes to the conventional processing steps or techniques or requiring additional steps. For example, one attempt to integrate pressure sensor structure comprising a polycrystalline silicon lamella required at least five mask planes and a complicated process for removing the sacrificial layer between the lamella and the substrate to enable the lamella to flex or move and could not be successfully integrated in a CMOS process.

SUMMARY

Embodiments relate to sensors and more particularly to structures for and methods of forming sensors that are easier to manufacture as integrated components and provide improved deflection of a sensor membrane, lamella or other movable element.

In an embodiment, a sensor device comprises a substrate; a plurality of support elements spaced apart from each other and arranged on the substrate; and a moveable element supported on and spaced apart from the substrate by the plurality of support elements, wherein the moveable element, the substrate and the plurality of support elements define a cavity into which the moveable element can deflect in response to a physical quantity to be sensed by the sensor device.

In an embodiment, a method comprises providing a substrate; providing a moveable element supported on the substrate by a plurality of support elements spaced apart from one another; and sensing a physical quantity by a deflection of the moveable element toward the substrate into a cavity defined by the substrate, the moveable element and the plurality of support elements.

BRIEF DESCRIPTION OF THE DRAWINGS

The invention may be more completely understood in consideration of the following detailed description of various embodiments of the invention in connection with the accompanying drawings, in which.

Figure 1:
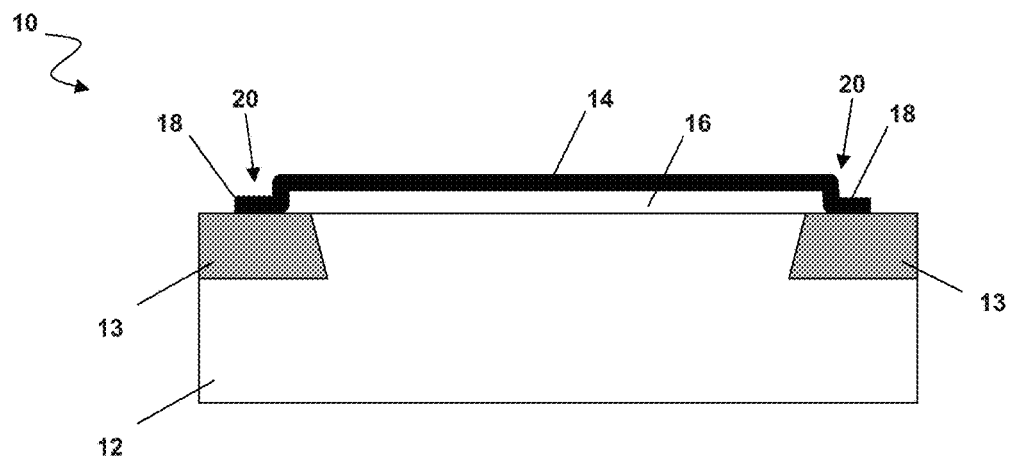
FIG. 1 is a side cross-sectional view of a conventional sensor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to sensors and more particularly to structures for and methods of forming sensors that are easier to manufacture as integrated components and provide improved deflection of a sensor membrane, lamella or other movable element. In embodiments, a sensor comprises a support structure for a lamella, membrane or other movable element. The support structure comprises a plurality of support elements that hold or carry the movable element. The support elements can comprise individual points or feet-like elements, rather than a conventional interconnected frame, that enable improved motion of the movable element, easier removal of a sacrificial layer between the movable element and substrate during manufacture and a more favorable deflection ratio, among other benefits.

Referring to FIG. 1, a sensor 10 is depicted. Sensor 10 comprises a substrate 12, a lamella 14 and a cavity 16. Lamella 14 is supported by a frame 18 which extends around a perimeter of lamella 14 between lamella 14 and shallow trench isolation (STI) portions 13 of substrate 12. In one embodiment, sensor 10 comprises a pressure sensor, and lamella 14 is pressure-sensitive, moving (e.g., by flexing downwardly or upwardly) in response to changes in pressure. Sensor 10 can comprise another type of sensor in other embodiments.

In embodiments, several mask planes (e.g., five or six in some cases) and a complicated process for removing the sacrificial layer below lamella 14 to form cavity 16 are necessary in the manufacture of sensor 10, making it difficult or impossible to integrate manufacture of sensor 10 with conventional processing, such as CMOS. For example, a sacrificial layer comprising, e.g., a sacrificial material that can be dry-etched, such as carbon, can be deposited on substrate 12 and structured prior to lamella 14, comprising, e.g., polycrystalline silicon, being deposited or formed on substrate 12 over the sacrificial layer. This process results in step 20 of frame 18. After deposition of lamella 14, the sacrificial layer can be removed, such as by ashing and subsequent removal of the material via small apertures formed in lamella 14 in one embodiment, to form cavity 16, which enables lamella 14 to move and flex in operation. Removal of the sacrificial layer in this way (i.e., via small apertures formed in lamella 14, such as near the corners) severely limits lateral dimensions of sensor 10, as clearing widths in such a scheme are finite.

Step 20 can be disadvantageous because it is a stress point, resulting in a bending movement of lamella 14 where lamella 14 meets frame 18. This bending movement can cause sagging of lamella 14 dependent on a variety of factors, including the geometry of sensor 10, stress, and temperature in addition to the desired pressure such that the sagging is included in the pressure sensor characteristic data as an undesirable, non-linear factor.

In embodiments, sensor 10 is generally square, with lateral dimensions of about 5 µm to about 15 µm (e.g., the width of sensor 10 in FIG. 1 is about 10 m and the length—the dimension into the page—is about 10 µm in one example embodiment). A size-related characteristic of sensor 10 is the ratio of the maximum deflection of lamella 14 during pressurization to the average deflection of lamella. In general, and for reasons relating to linearity and the production of sensor 10 (i.e., the formation of cavity 16), the maximum deflection should not exceed about 10 percent of the height of cavity 16, which can lead to a larger and thicker lamella 14 that is undesirable because of size limitations and cost constraints. The average deflection, on the other hand, is related to the capacitive sensor signal. A configuration in which the ratio of maximum deflection to average deflection is as small as possible therefore can be advantageous.

Figure 2:
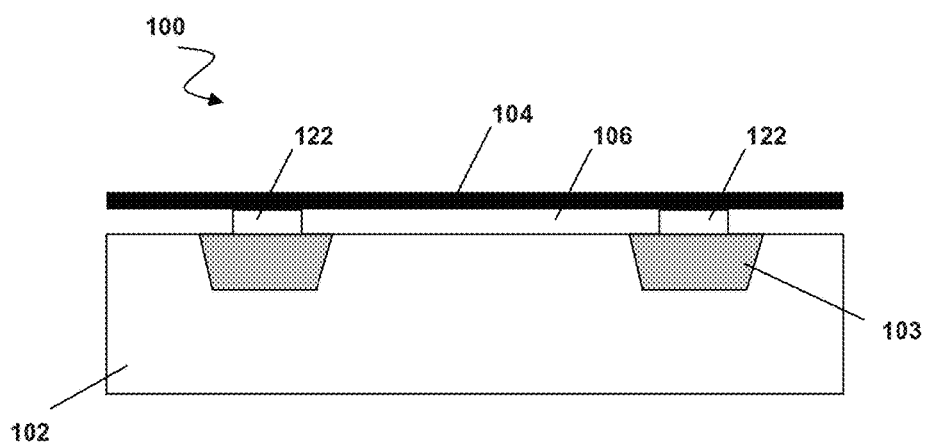
FIG. 2 is a side cross-sectional view of a sensor according to an embodiment.

Referring to FIG. 2, another sensor 100 is depicted. Similar to sensor 10 previously discussed, sensor 100 comprises a substrate 102, such as a semiconductor or other suitable material, and a moveable element 104, such as a lamella, membrane or other suitable structure. In contrast with frame 18 of sensor 10, however, sensor 100 comprises a support structure comprising a plurality of support elements 122. Each support element 122 comprises a punctiform structure or "foot" arranged on an isolation trench portion 103 of substrate 102, spaced apart from and independent of the other support elements. Though the size and configuration can vary, in embodiments each support element 122 is generally square-shaped and has a lateral dimension of less than about 3,000 nm, such as lateral dimensions of about 500 nm by 500 nm and a height of about 20 nm to about 400 nm, though support elements can be larger or smaller and/or have some other shape (e.g., round, triangular, oval, rectangular, hexagonal, some other single- or multi-sided shape, etc.) in other embodiments. For example, in one embodiment sensor 100 is triangularly shaped and comprises three support elements 122. A cavity 106 separates and is defined by substrate 102 and moveable element 104. The height of support elements 122 defines the height of cavity 106 (i.e., the distance between a bottom surface of moveable element 104 and a top surface of substrate 102), and the height can be in a range of about 20 nm to about 200 nm in some embodiments.

In one embodiment, portion 103 comprises oxide or another suitable material, and support elements 122, like moveable element 104, can comprise silicon, such as polycrystalline silicon in one embodiment. The materials, dimensions and other characteristics of various elements discussed herein are merely examples and can vary from that which is depicted (which is generally not scale) and discussed in other embodiments, without limitation unless otherwise mentioned.

Figure 3:
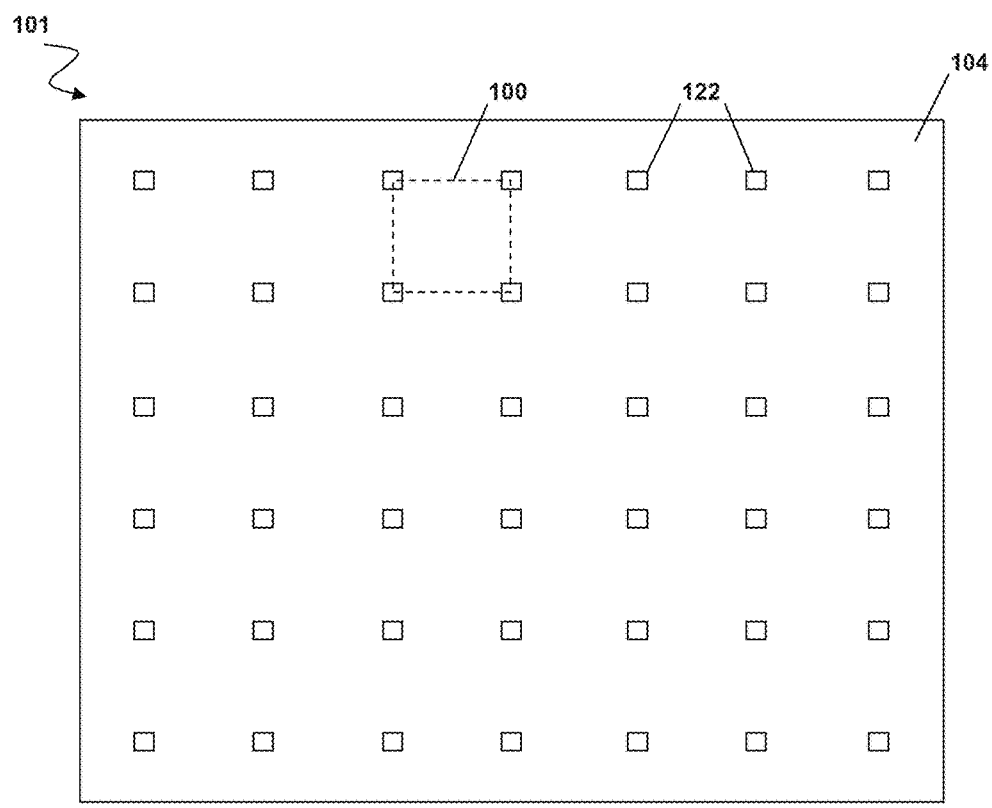
FIG. 3 is a top partially transparent view of a moveable element and support elements of a sensor according to an embodiment.

While a single sensor 100 can be formed on substrate 102, in some embodiments arrays of sensors 100 will be formed on substrate 102. FIG. 3 depicts a top view of such an array 101 of sensors 100, with moveable element 104 in transparency in order to see support elements 122 underneath. The number of sensors 100 of any array 101 can vary from that depicted in FIG. 3 and, practically speaking, can be significantly larger than the thirty sensors 100 depicted but can also be smaller. For example, in one embodiment array 101 comprises 400 sensors 100 arranged in a 10×40 configuration. In embodiments, the number of support element 122 is greater than 20, such as greater than 50 in some embodiments, and greater than 100 in still other embodiments. Therefore as can be seen in FIGS. 2 and 3, the plurality of support elements 122 are distinct, separate and non-contiguous with respect to one another.

Each sensor 100 is generally square-shaped and supported by four support elements 122, though other configurations (i.e., different sensor shapes and/or more or fewer support elements 122) can be implemented in other embodiments. Thus, in FIG. 3, each sensor 100 is defined, in part, by the four support elements 122 supporting a portion of moveable element 104. Support elements 122 can be in arranged in a regular manner in some embodiments, such as in a regular matrix. In some embodiments, each support element 122 can have the same distance to an adjacent support element 122, and this distance can be in a range of about 2 µm to about 20 µm in embodiments, though this distance can also be greater or smaller in other embodiments.

In some embodiments, support elements 122 can be arranged in a non-regular manner, i.e., with varying distances to one or more adjacent support elements 122. This can, for example increase a measurement range or tailor a sensor behavior since a support element 122 having a greater distance to the next support element 122 may provide a higher sensitivity, and shorter distances to the next support element 122 may provide the capability to measure at higher pressures. For example, the distances between adjacent support elements 122 can be varied in embodiments in a range of about 2 µm to about 20 µm, and can vary from support element to support element. The distances also can be greater or smaller in other embodiments, For regular arrangements as well as for non-regular arrangements, the selection of the distances between adjacent support elements 122 can be used to specifically tailor the sensors to one or more requirements of the sensor or application. For example, high pressure sensors can be designed to have smaller distances between adjacent support elements 122, and low pressure sensors can be designed to have greater distances between adjacent support elements 122. Wide measurement range sensors can be designed to have a wide variation of the distances between adjacent support elements across the sensor.

In embodiments, additional support elements 122 can be implemented in array 101 in areas of increased tensile stress or where additional support is otherwise desired or required. For example, in some embodiments additional support elements 122 are provided along the perimeter or outer edges of array 101, or along some interior part or portion of the array. Moveable element 104 can comprise a single contiguous structure coupled to, applied on or formed with the plurality of support elements 122 in various embodiments. Each sensor 100 also comprises a corresponding portion of substrate 102 (see FIG. 2) opposite moveable element 104, as well as other elements not specifically depicted or visible, such as electrodes, wires, pads, control circuitry and other components.

For either a single sensor 100 or array 101 of sensors 100, numerous advantages are provided in embodiments. First, the removal of the sacrificial layer between substrate 102 and moveable element 104 is made easier via much wider and easier to access sides or edges of sensor 100 or array 101, which are open and are not closed off by frame 18 as in FIG. 1, though after removal of the sacrificial layer can be sealed by a dielectric layer or other layer or structure. This removes constraints on sensor size and configuration, which previously were necessary in order to ensure that the entire sacrificial layer could be removed.

Figure 4A:
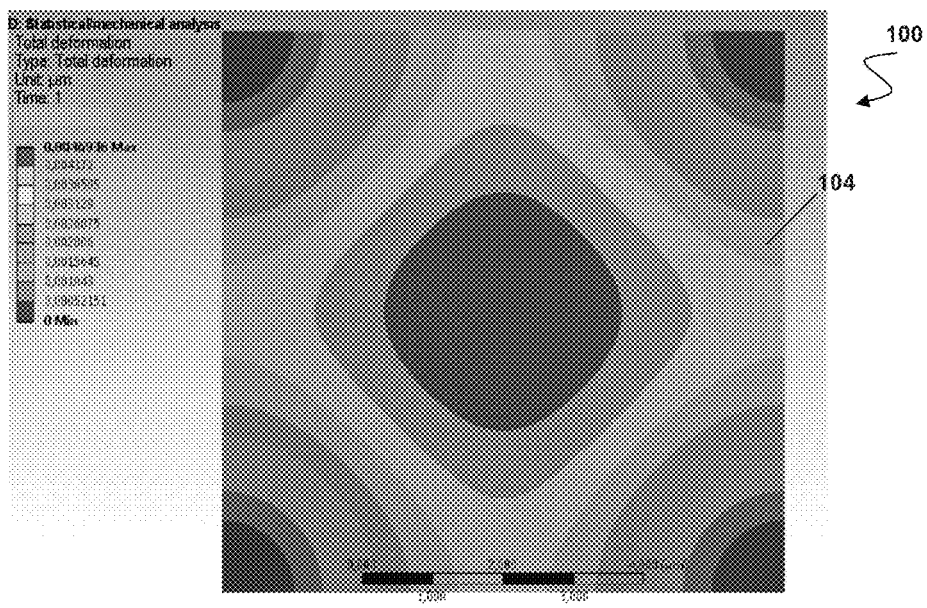
FIG. 4A is a simulation result of a sensor according to an embodiment.
Figure 4B:
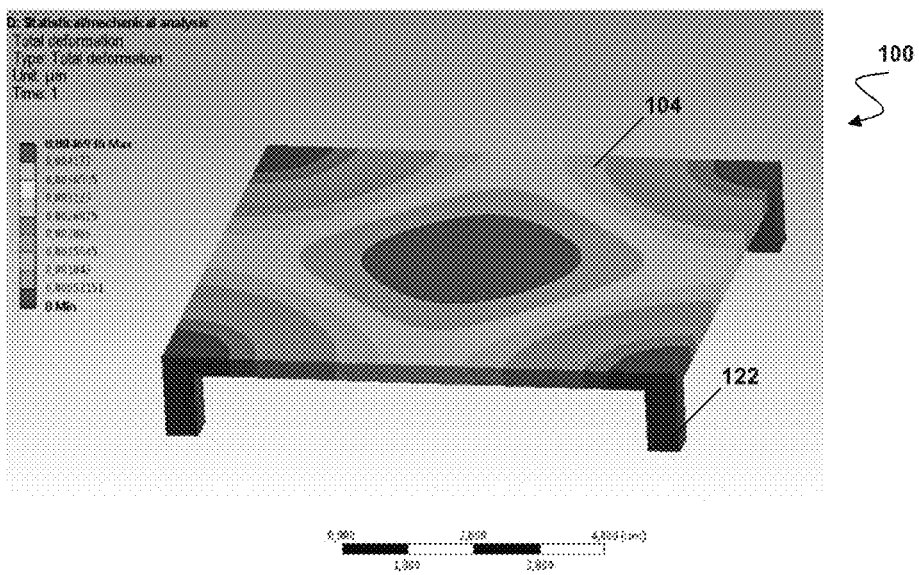
FIG. 4B is a simulation result of a sensor according to an embodiment.
Figure 4C:
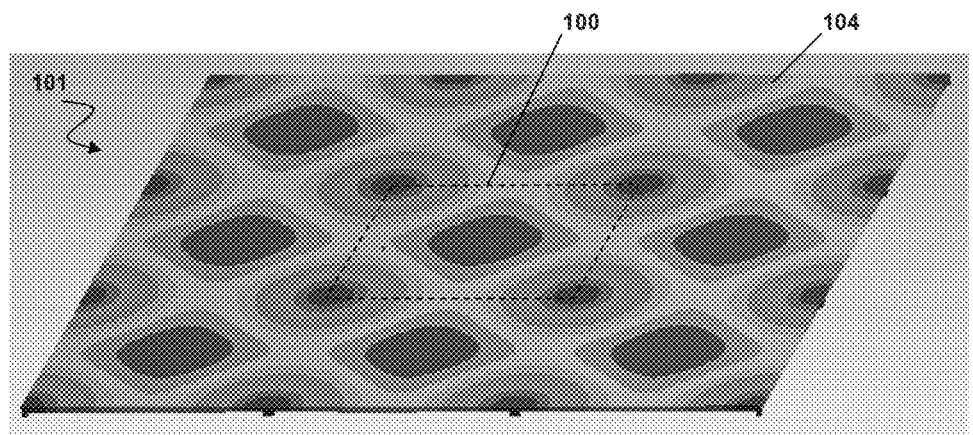
FIG. 4C is a simulation result of a sensor array according to an embodiment.
Figure 4D:
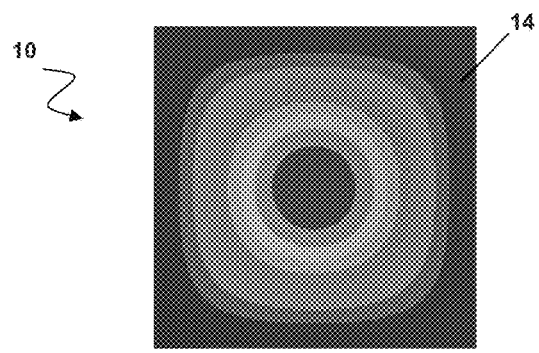
FIG. 4D is a simulation result of a conventional sensor.

Additionally, the ratio of maximum deflection of moveable element 104 to average deflection of moveable element 104 is improved. In one example, the ratio for sensor 10 of FIG. 1 is about 3.5, whereas the same ratio for sensor 100 of FIG. 2 or 3 is reduced to about 1.65, which is a significant improvement. FIGS. 4A and 4B depict simulation results for a sensor 100 within an array, and FIG. 4C for an array 101, with one bar of pressure applied without intrinsic stress. For comparison, simulation results for sensor 10 of FIG. 1 are also included in FIG. 4D. A comparison of FIGS. 4A and 4D shows improved deflection in the embodiment of FIG. 4A. The central area of maximum deflection of moveable element 104 (about 4.7 nm in this simulation, in which sensor 100 is about 8 $\mu$m by 8 $\mu$m) is larger and differently shaped than that of lamella 14 of FIG. 4D.

While the improved ratio can provide advantages with respect to sensor performance, such as increased linearity and/or sensitivity, the combination of these two advantages enables structuring and formation of advantageous sensors 100 and sensor arrays 101 that do not require the previously necessary clearing holes that limited size and configuration and make integration of a sensor 100 or array 101 of sensors 100 with other structures and processes, including CMOS processing, possible.

Figure 5:
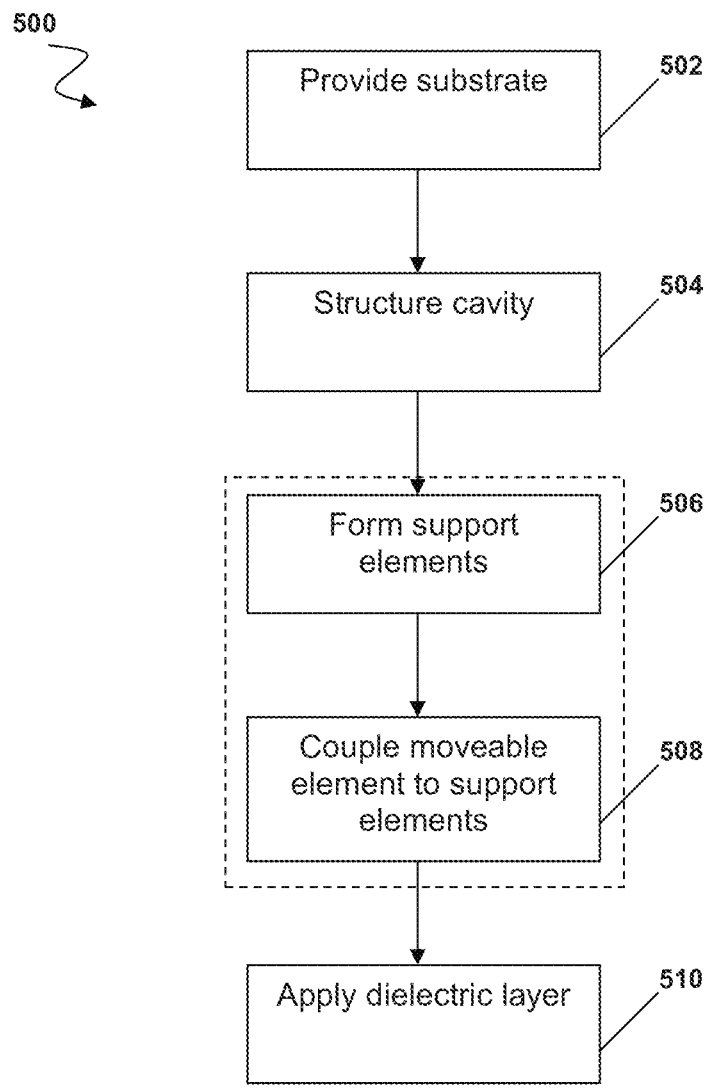
FIG. 5 is a flowchart of a method of forming a sensor according to an embodiment.

Thus, in one embodiment and referring to flowchart 500 of FIG. 5, a substrate is provided at 502. At 504, the cavity is structured on substrate, and at 506 the support elements are formed on the substrate. At 508, the moveable element is coupled to the structure by the support elements. In some embodiments, 506 and 508 are carried out jointly, such as by deposition of a single layer that forms the support elements and the moveable element. This is illustrated by the dashed lines in FIG. 5. At 510, a dielectric layer is applied between the substrate and the moveable element to seal the cavity. This process, its contents and/or the order of the various actions can vary according to an embodiment and/or a process used to form a circuit (e.g., ASIC) or structure with or in which sensor 100 or array 101 is integrated.

For example, in one embodiment following a similar process to that illustrated in FIG. 5, deposition and structuring of a sacrificial layer (e.g., to form the cavity) is carried out, including forming holes for the support elements. Next, a layer, such as polysilicon, is formed and structured to form the support elements and the moveable element. Then, an oxide layer, such as a high density plasma (HDP) oxide in one embodiment, is applied for evacuation and to form a lateral sealing layer.

Sensor 100 and/or array 101 of sensors 100 can comprise pressure sensors in embodiments. In operation and in response to a pressure applied or otherwise present, moveable element 104 moves, such as by sagging, flexing or otherwise deflecting, into cavity 106 and toward substrate 102. This movement can be sensed, such as by a change in capacitance as the distance separating moveable element 104 and substrate 102 changes, and from that change in capacitance the pressure applied or other present can be determined. In other embodiments, sensor 100 and/or array 101 can comprise a sensor other than a pressure sensor (e.g., acceleration, force, etc.) and/or can rely on an effect other can capacitance (e.g., piezoresistive, piezoelectric, electromagnetic, optical or some other technology).

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor device comprising:
   a substrate;
   a plurality of distinct, separate, non-contiguous support elements spaced apart from each other and arranged on the substrate; and
   a moveable element supported on and spaced apart from the substrate by the plurality of distinct, separate, non-contiguous support elements, wherein the moveable element, the substrate and the plurality of distinct, separate, non-contiguous support elements define a cavity into which the moveable element can deflect in response to a physical quantity to be sensed by the sensor device.

2. The sensor device of claim 1, wherein the moveable element comprises a membrane or a lamella.

3. The sensor device of claim 2, wherein the moveable element comprises silicon.

4. The sensor device of claim 3, wherein the silicon comprises polycrystalline silicon.

5. The sensor device of claim 1, wherein the sensor device comprises a pressure sensor device, and wherein the physical quantity to be sensed is pressure.

6. The sensor device of claim 5, wherein the pressure is sensed by sensing a capacitance between the moveable element and the substrate.

7. The sensor device of claim 1, wherein each of the distinct, separate, non-contiguous support elements comprise a punctiform structure having a lateral dimension that is less than about 3,000 nanometers (nm).

8. The sensor device of claim 7, wherein the punctiform structure has lateral dimensions of about 500 nm by about 500 nm.

9. The sensor device of claim 1, wherein the sensor device comprises a plurality of sensors, each of the plurality of sensors comprising a plurality of distinct, separate, non-contiguous support elements and a portion of the moveable element supported on that plurality of distinct, separate, non-contiguous support elements.

10. The sensor device of claim 9, wherein adjacent ones of the plurality of sensors have at least one of the plurality of distinct, separate, non-contiguous support elements in common.

11. The sensor device of claim 9, further comprising a sealing layer arranged between the substrate and the moveable element along a perimeter of the sensor device.

12. The sensor device of claim 11, wherein the sealing layer comprises a dielectric layer.

13. A sensor device comprising:
    a substrate;
    a plurality of distinct, separate, non-contiguous support elements spaced apart from each other and arranged on the substrate; and
    a moveable element supported on and spaced apart from the substrate by the plurality of distinct, separate, non-contiguous support elements, wherein the moveable element, the substrate and the plurality of distinct, separate, non-contiguous support elements define a cavity into which the moveable element can deflect in response to a physical quantity to be sensed by the sensor device,
    wherein the substrate comprises a semiconductor material comprising a plurality of distinct isolation portions formed of an electrically insulating material, and wherein each of the plurality of distinct, separate, non-contiguous support elements is arranged on a respective one of the plurality of distinct isolation portions.

14. The sensor device of claim 1, wherein a ratio of maximum deflection of the moveable element to average deflection of the moveable element is less than about 2.

15. The sensor device of claim 1, wherein the moveable element and the plurality of distinct, separate, non-contiguous support elements are integrally formed with one another.

16. A method comprising:
    providing a substrate;
    providing a moveable element supported on the substrate by a plurality of distinct, separate, non-contiguous support elements spaced apart from one another; and
    sensing a physical quantity by a deflection of the moveable element toward the substrate into a cavity defined by the substrate, the moveable element and the plurality of distinct, separate, non-contiguous support elements.

17. The method of claim 16, wherein sensing a physical quantity further comprises sensing a capacitance between the substrate and the moveable element.

18. The method of claim 16, wherein for each of the plurality of distinct, separate, non-contiguous support elements a distance to an adjacent one of the plurality of distinct, separate, non-contiguous support elements is in a range of about 2 micrometers ($\mu$m) to about 20 $\mu$m.

19. The method of claim 16, wherein the moveable element comprises a silicon layer.

* * * * *